United States Patent

Ghirardi et al.

[11] Patent Number: 5,703,895
[45] Date of Patent: Dec. 30, 1997

[54] OPTO-ELECTRONIC SEMICONDUCTOR DEVICE INCLUDING AN INTEGRATED MODE TRANSFORMER

[75] Inventors: Frédéric Ghirardi, Paris; Boumédienne Mersali, Arcueil; Adrien Bruno, Palaiseau; Louis Giraudet, Pantin, all of France

[73] Assignee: France Telecom, Paris, France

[21] Appl. No.: 431,092

[22] Filed: Apr. 28, 1995

[30] Foreign Application Priority Data

May 2, 1994 [FR] France .................... 94 05304

[51] Int. Cl.$^6$ .................................... H01S 3/19
[52] U.S. Cl. ..................... 372/50; 385/14; 385/131
[58] Field of Search ................... 372/50; 385/131, 385/14, 88; 257/83, 84

[56] References Cited

U.S. PATENT DOCUMENTS 4,349,905  9/1982  Ackley ........................ 372/46

FOREIGN PATENT DOCUMENTS 0-461632-A2  12/1991  European Pat. Off. ........... 372/43
60-193393    10/1985  Japan ........................ 372/50

OTHER PUBLICATIONS

"Simple and Low–Loss Fibre–to–Chip Coupling by Integrated Field–Matching Waveguide in InP" by Schwander et al, Electronic Letters, Feb. 18, 1993, vol. 29, No. 4.
"Integrated Optical Modeshape Adapters in InGaAsP/InP for Efficient Fiber–to–Waveguide Coupling" by Brenner et al, IEEE, Sep. 1993.
"InGaAlAs/InAlAs Multiple Quantum Well Phase Modulator Integrated with Spot Size Conversion Structure" by Yoshimoto et al, IEEE Feb. 1994.
"High Responsivity Integrated Tapered Waveguide PIN Photodioede" by G. Bauer et al, 19th European Conference on Optical Communcation, Sep. 1993, vol. 2.

Primary Examiner—Rodney B. Bovernick
Assistant Examiner—Yisun Song
Attorney, Agent, or Firm—Pollock, Vande Sande & Priddy

[57] ABSTRACT

A semiconductor opto-electronic device including at least one electronic function component (62), at least one optical function component (60) and a mode transformer associated with the optical function component. At least some layers of semiconductor material constituting the electronic function component also form optical layers in the mode transformer zone and, at least in the mode transformer zone, these semiconductor material layers are non-absorbent at the operating wavelength. The mode transformer is preferably etched in the shape of an hourglass.

28 Claims, 2 Drawing Sheets

OPTO-ELECTRONIC SEMICONDUCTOR DEVICE INCLUDING AN INTEGRATED MODE TRANSFORMER

FIELD OF THE INVENTION

The present invention relates to the field of opto-electronic semiconductor devices.

BACKGROUND OF THE INVENTION

Opto-electronic devices combine optical function components such as lasers, optical waveguides, modulators and photodiodes with electronic function components based on transistors.

Many opto-electronic devices are designed to be coupled to optical fibers, especially in the field of optical telecommunications.

However, opto-electronic devices and optical fibers have different optical modes: the optical modes of the optical circuits integrated into opto-electronic devices are usually narrow and elliptical, typically 5 µm by 1 µm, whereas the modes of optical fibers are generally circular and larger, typically having a diameter of 8 µm to 11 m.

Correct coupling of an opto-electronic device to a fiber therefore requires a mode transformer between them to transform the optical mode, i.e., to make it wider or narrower (to match it).

Coupling from one mode to another is quantified by the square of the integral of the overlap between the two fields.

The coupling is ideally equal to 1 if the two modes are concentric and identical at all points.

For optimal coupling at least one of the two modes must be converted so that it acquires the shape of the other mode.

This can be done in the fiber or in the optical circuit.

When it is done in the fiber, the mode transformer is usually a lens on the fiber. Theoretically the coupling can then be very good, but positioning tolerances are very tight since the two modes to be coupled are small. A fiber/opto-electronic circuit positioning error of 1 µm to 2 µm typically produces a coupling loss of 90%. Using a mode transformer on the optical fiber therefore amounts to transferring the problem to the mechanical assembly. Also, it is difficult to make the fiber mode elliptical, with the result that the coupling is never equal to 1.

For these reasons it is preferable to use a mode transformer in the optical circuit, by modifying the optical waveguide integral therewith.

This constitutes a collective approach to the problem in that thousands of components of the same type can be fabricated simultaneously. The mode can be converted to a circular mode. The positioning tolerances are larger than in the previous method because the two modes being coupled together are larger than in the lensed fiber/waveguide situation.

Various methods have been proposed in the prior art for mode transformation in the optical circuit of optical components.

The following six documents are examples of these disclosures:

[1] G. Miller, L. Stoll, G. Wenger and M. Schienle, "First low loss InP/InGaAsP optical switch with integrated mode transformers", ECOC, Montreux, 1993, pp 37–40

[2] R. J. Deri, N. Yasuoka, M. Makiuchi, A. Kuramata and O. Wada, "Efficient fiber coupling to diluted multiple quantum well waveguides", Appl. Phys. Lett., 1989, 55, pp 1495–1497

[3] T. L. Koch, U. Koren, G. Eisenstein, M. G. Young, M. Oron, C. R. Giles and B. L. Miller, "Tapered waveguide InGaAs/InGaAsP multiple quantum well lasers", IEEE Photonics Tech. Lett., 1990, 2, pp 88–90

[4] T. Brenner, W. Hunziker, M. Smit, M. Bachmann, G. Guekos and H. Melchior, "Vertical InP/InGaAsP tapers for low-loss optical fiber-waveguide coupling", Electron. Lett. Vol. 28, No 22, October 1992, pp 2040–2041

[5] R. Zengerle, H. Breckner, H. Olzhausen and A. Kohl, "Low-loss fiber-chip coupling by buried laterally tapered InP/InGaAsP waveguide structure", Electron. Lett. Vol. 28, No 7, March 1992, pp 631–632

[6] J. G. Bauer et al, "High Responsivity Integrated Tapered Waveguide PIN Photodiode", CCOC 93.

To be more precise, two problems must be solved to carry out the mode transformation in the optical circuit:

(a) matching the mode of the coupling waveguide to the fiber, and (b) converting the coupling mode adiabatically into a smaller mode, i.e., that of the optical circuit.

One suggested solution to problem (a) is to obtain an average index in the guide zone close to the index of the confinement zone. Two ways of achieving this have been suggested:

obtaining a similar material directly, e.g., by doping: InP/InP n+(see document [1]); however, although theoretically possible, it is difficult to obtain two materials of different composition having similar indices; and diluting a material of different index in the confinement material (see document [2]), thereby creating a material with an average index close to the index of the confinement material.

One suggested solution to problem (b) is to reduce and to eliminate the guide layer of the optical circuit. Various methods have been suggested:

tapering the guide layer, either in steps or directly (see documents [1, 3, 4]);

forming the guide layer with a point, using one or more lithographic masking and etching stages (see document [5]); and obtaining an average index by segmenting the waveguide.

Mode changes from one state to the other by adiabatic transformation.

Those skilled in the art knows that it is desirable to integrate the electronic function components on the optical circuit to enable direct electrical/optical conversion on sending and on receiving. In particular, this eliminates spurious effects due to the mechanical assembly in high data rate applications.

However, despite considerable research in this field, fuelled mainly by the potential spin-off in fiber optic telecommunications, the inventors are not aware of any complete semiconductor structure integrating electronic function components and mode transformers.

This seems to be because until now the constraints associated with the fabrication of electronic function components based on transistors and those associated with the design of mode transformers have been seen as incompatible a priori.

In particular, if high performance is required, electronic function components based on transistors have to be fabricated on a semi-insulator substrate to avoid stray capacitance. For this reason it is not feasible to use InPn-/InPn+ structures.

Also, the semiconductor material layers usually employed for active components such as transistors are absorbent at the optical wavelengths used in optical telecommunications.

For this reason, prior to the present invention, those skilled in the art would not have considered integrating mode transformers into structures including electronic function components without removing the electronic function component layers and carrying out further epitaxy to fabricate the mode transformer and the waveguide.

Despite received wisdom founded on the prior art as summarized hereinabove, the aim of the inventors has been to integrate purely electronic function components (for example circuits based on transistors) with optical function components and mode transformers.

SUMMARY OF THE INVENTION

To be more precise, the main object of the invention is to enable implementation on an optical circuit of a mode transformer to match the mode of an optical fiber and the mode of the optical circuit in order to relax positioning tolerances and increase coupling efficiency.

A subsidiary object of the invention is to propose a method of integrating electronic function components, optical function components, and mode transformers that requires only a small number of epitaxy stages and masking levels and which reduces level alignment problems.

In the context of the present invention, this object is achieved by a semiconductor opto-electronic device including at least one electronic function component, at least one optical function component, and a mode transformer associated with the optical function component, wherein at least some layers of the semiconductor material constituting the electronic function component also form optical layers in the mode transformer zone and, at least in the mode transformer zone, these semiconductor material layers are non-absorbent at the operating wavelength.

In a first embodiment of the present invention, the semiconductor material layers simultaneously forming the electronic function component and layers in the mode transformer zone are made from a homogeneous material which has an apparent forbidden band gap such that the operating wavelength is not absorbed by these layers.

In a second embodiment of the present invention, the semiconductor material layers simultaneously forming the electronic function component and layers in the mode transformer zone are made from a material that is initially homogeneous and is rendered locally non-absorbent at the operating wavelength in the optical part.

In a third embodiment of the present invention the semiconductor material layers simultaneously forming the electronic function component and layers in the mode transformer zone are made from a material that is initially homogeneous and is treated locally in the electronic function component part to have a forbidden band gap compatible with that function.

Thus, a fundamental feature of the invention is its use for the electronic function components of a semiconductor material compatible with the optical structure. To this end, the narrow forbidden band gap layers of conventional electronic components are replaced by layers in which the apparent forbidden band gap is wider and such that the operating wavelength is not absorbed where these layers are treated locally to render the material non-absorbent in the optical part and/or so that the material has a narrow forbidden band gap in the electronic component part.

In accordance with another advantageous feature of the invention, the various layers of semiconductor material constituting the device of the present invention are deposited epitaxially on a substrate including an etched step the height of which is equal to the sum of the thicknesses of the layers deposited epitaxially less the thickness of the layers constituting the electronic function component.

In accordance with another advantageous feature of the invention, after epitaxy, the layers on top of those constituting the electronic function component are removed at the top of the etched step of the substrate.

In accordance with another advantageous feature of the invention, the mode transformer is formed not by forming a pointed guide layer but rather by total etching of a stripe of the guide layer in zones of varying pitch. This method has previously been used for diffused waveguides, but the invention now applies it to etched sections.

The invention also provides a method of fabricating an opto-electronic device which includes the step of forming an hourglass-shape mode transformer having a wide mode entry part, a zone of decreasing width to push down the mode and a zone of increasing width to transfer the wide mode to a waveguide.

Document [7] Electronics Letters Vol. 29, No 4 The SCHWANDER et al, "Simple and low loss fiber to chip coupling by integrated field matching waveguide in InP", describes a mode transformer device made by depositing a layer of Sn doped InP on a semi-insulator InP substrate, then depositing an InP guide layer that is not intentionally doped, etching the waveguide, growing a layer of quaternary InGaAsP by liquid phase epitaxy, etching this layer to a point, and depositing and etching an InP covering layer that is not intentionally doped. The structure described in that prior art document has the drawback of a point in the quaternary guide layer. Also, it is not possible to push down the mode, since the narrow mode waveguide faces the wide mode.

DESCRIPTION OF THE DRAWINGS

Other features, objects and advantages of the present invention emerge on reading the following detailed description and from the appended drawings which are given by way of example only, and in which.

DETAILED DESCRIPTION

Figure 1:
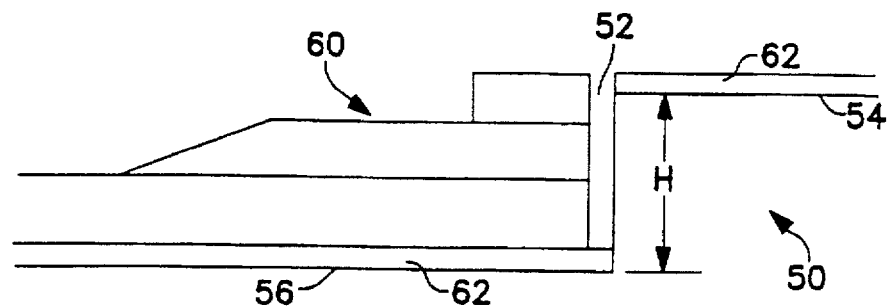
FIG. 1 is a view in vertical section of an opto-electronic structure with integrated mode transformer according to the present invention.

The general structure of the device of the present invention as shown in FIG. 1 and the method of obtaining it will be described first.

The first step of the method is to produce a semi-insulator substrate 50 incorporating a right-angle vertical step 52.

Various stacked layers 60 of semiconductor material are then deposited epitaxially on the substrate 50 (FIG. 1).

To be more precise, lower layers 62 deposited in this way provide the transistor-based electronic function, and all of the layers 60 deposited epitaxially, including the lower layers 62 just mentioned, provide the optical function.

The height H of the step 52 is equal to the sum of the thicknesses of the layers 60 deposited epitaxially less the thickness of the lower layers 62 providing the transistor-based electronic function.

After depositing the layers 60 epitaxially on the substrate 50, the layers on top of the lower layers 62 are removed in the upper part 54 of the substrate 50. This produces a planar structure in which the top surface of the layers 62 remaining in the top part 54 of the substrate is flush with the top surface of the layers 60 deposited on the lower part 56 of the substrate.

The transistor-based electronic function component is formed in the upper part 54 of the substrate by the layers 62. The optical function component is formed in the lower part 56 of the substrate by all of the layers 60, with a contribution from the substrate 50 itself where appropriate.

Communication between the electronic function component in the upper part 54 of the substrate and the optical function component in the lower part 56 of the substrate is provided at the level of the upper layers of the optical function component facing the layers 62 of the electronic function component.

As already mentioned, in the context of the invention, the semiconductor material layers 62 constituting the electronic function component also form the lower optical layers in the mode transformer zone. However, because the semiconductor material layers 62 forming the electronic function component have an apparent forbidden band gap such that the operating wavelength is not absorbed by these layers, at least in the optical part, the simultaneous use of the layers 62 in the electronic function component and in the optical function component does not disrupt the operation of the latter.

The device of the present invention enables direct electrical/optical conversion in both directions (sending or receiving).

The present invention also enables direct epitaxial deposition of the electronic function component on the semi-insulator substrate, preventing stray capacitance.

By virtue of the present invention, the layers of the electronic function component are directly accessible on the upper part 54 of the structure. Any conventional process can therefore be used to form the submicron scale gate of this component.

The electronic function components formed by the layers 62 deposited on the upper part 54 of the substrate can constitute transistors of various types, for example, such as field-effect transistors or bipolar transistors.

Compared to solutions that were previously feasible, given the state of the art in this field, the present invention allows integration of the mode transformer on a substrate carrying an electronic function component without removing layers of the latter and carrying out further epitaxy to form the mode transformer and the associated waveguide.

An essential feature of the invention is thus its replacement of the narrow forbidden band gap layers conventionally used to form transistors with layers having a wider apparent forbidden band gap, or its local treatment of the semiconductor material layers which simultaneously form the electronic function component and the mode transformer to render this material compatible with said electronic function and said mode transformer function.

The apparent forbidden band gap can correspond directly to the forbidden band gap of one of the materials used or to the forbidden band gap resulting from quantum effects. The apparent forbidden band gap must be such that light at the operating wavelength is not absorbed in the optical function component.

By way of example, the apparent forbidden band gap of the layers 62 forming the electronic function component can be in the order of 1.4 μm for the 1.52μ to 1.57μ window.

The layers of the electronic function component are then thin enough to constitute a diluted material. The mode structure can be modified at will by adding a few extra layers to the waveguide structure.

The wide mode is partly guided in the substrate 50 which reduces the thickness of the epitaxial layers required and therefore provides sufficient planarization for the electronic function components.

If the structure is optimized, the performance of these components can be generally the same as that of structures using a narrow forbidden band gap.

In the case of quaternary channel field-effect transistors, for example, the cut-off frequency may be slightly lower, but in contrast noise performance is improved.

The wide mode to narrow mode coupling can be achieved by any of the methods previously described in the prior art, or by a combination of those methods.

For example, the wide mode to narrow mode coupling can be achieved by tapering the guide layer, directly or by means of steps, or by forming a point in the guide layer, for example using a plurality of lithographic masks and etching stages.

Figure 2:
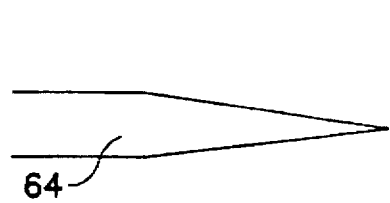
FIG. 2 is a plan view of a pointed mode transformer element.

FIG. 2 shows a conventional pointed guide layer 64 for wide mode to narrow mode coupling.

However, the present invention also proposes a new coupling method.

The size of the point required to deconfine the modes is in the order of 20 nm and edgewise exposure has to be used to reduce the guide layer 64 to a point, imposing severe constraints.

To eliminate this problem the present invention dispenses with forming a point in the guide layer, substituting total etching away of the stripe 64 constituting the guide layer in zones of varying pitch.

Figure 3:
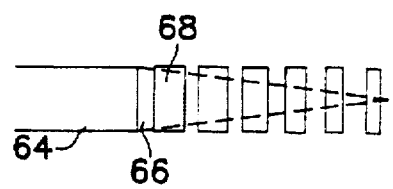
FIG. 3 is a plan view of a mode transformer element of the present invention formed by total etching away of areas of varying pitch from a stripe of the guide layer.

By "varying pitch" is meant that the zones 66 that are totally etched (i.e., totally eliminated) are of progressively increasing thickness in the direction away from the stripe 64 constituting the guide layer, and the discrete elements 68 of the guide layer 64 that remain between two etched zones 68 are of progressively decreasing thickness going away from the stripe 64 constituting the guide layer. The final structure obtained (see FIG. 3) has the same average index as a physically pointed guide layer (as shown in FIG. 2) but is not subject to the same constraints as the latter.

The present invention applies not only to coupling an opto-electronic structure to a cleaved fiber but also to coupling an opto-electronic structure to a lensed optical fiber of reasonable mode size, for example 5 μm to 8 μm. A lensed fiber of this kind can easily be produced using techniques familiar to those skilled in the art, and in this context the invention significantly increases positioning tolerances. This naturally requires the coupling to be able to produce a circular mode.

The present invention can find applications in the manufacture of many opto-electronic structures.

Applications of the invention will now be described, firstly to the manufacture of a waveguide-PIN-HFET detector circuit and secondly to the manufacture of an emitter type circuit such as an optical emitter or an electrical/optical transducer possessing integrated control electronics.

Figure 4:
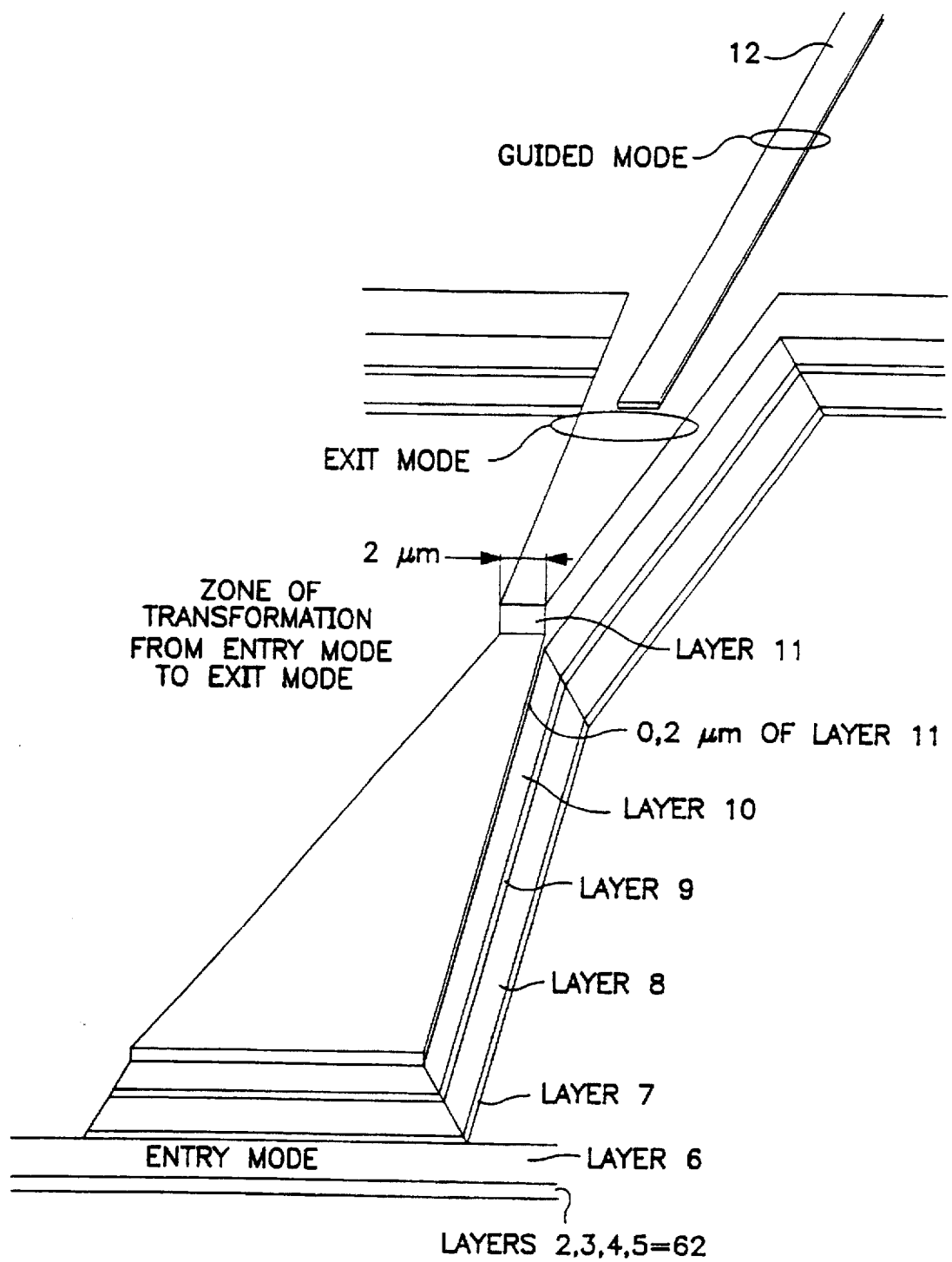
FIG. 4 is a partial perspective view of a waveguide-PIN-HFET opto-electronic structure of the present invention.

The waveguide-PIN-HFET detector structure is described first with reference to FIG. 4.

The first step of the method is to form an etched substrate incorporating a right-angle vertical step 52.

The 16 layers defined in Table I are then deposited epitaxially.

TABLE I

| layer | material | gap | thick-ness | doping | type | index | comment |
|---|---|---|---|---|---|---|---|
| 16 | GaInAs | | 250Å | <5.10$^{15}$ | n− | 3.535–i0.083 | contact |
| 15 | InP | | 0.3μ | <5.10$^{15}$ | n− | 3.172 | diff'n window |
| 14 | GaInAs | | 0.4μ | <5.10$^{15}$ | n− | 3.535–i0.083 | absorbent |
| 13 | GaInAsP | 1.37μ | 0.3μ | 5.10$^{18}$ | n+ | >3.381 | n+ contact |
| 12 | InP | | 250Å | <5.10$^{15}$ | n− | 3.172 | etch stop |
| 11 | GaInAsP | 1.3μ | 0.65μ | <5.10$^{15}$ | n− | 3.381 | guide |
| 10 | InP | | 0.8μ | <5.10$^{15}$ | n− | 3.172 | buffer |
| 9 | GaInAsP | 1.3μ | 0.05μ | <5.10$^{15}$ | n− | 3.381 | buffer |
| 8 | InP | | 0.8μ | <5.10$^{15}$ | n− | 3.172 | buffer |
| 7 | GaInAsP | 1.3μ | 0.1μ | <5.10$^{15}$ | n− | 3.381 | buffer |
| 6 | InP | | 0.8μ | <5.10$^{15}$ | n− | 3.172 | buffer |
| 5 | GaInAsP | 1.37μ | 250Å | <5.10$^{15}$ | n− | 3.4 | contact |
| 4 | AlInAs | | 500Å | <5.10$^{15}$ | n− | 3.21 | gate |
| 3 | GaInAsP | 1.3μ | 500Å | 4.10$^{17}$ | n | 3.381 | channel |
| 2 | GaInAsp | 1.3μ | 500Å | 4.10$^{17}$ | n | 3.381 | channel |
| 1 | InP substrate | | 500Å | .10$^{17}$ | S.I. | 3.169 3.169 | buffer |

The height H of the step on the etched substrate 50 corresponds to the thickness of layers 6 through 16 and is 4.2 μm in the specific example defined in Table I.

Layers 1 through 5 deposited on the upper part 54 of the substrate form a field-effect transistor (FET).

Layers 1 through 10 (and in particular layers 1 through 5 just mentioned) deposited on the lower part 56 of the substrate form the mode transformer; stacked layers 11 and 12 form an optical waveguide; and layers 13 through 15 form a PIN. Thus all the layers deposited on the lower part 56 of the substrate constitute an optical function component.

Following epitaxial deposition of layers 1 through 16, layers 6 through 15 are removed in the upper part 54. This produces a planar structure with the top surface of the layer 5 deposited on the upper part 54 flush with the top surface of the layer 16 deposited on the lower part 56.

The p+ windows of the PIN are diffused.

The p and n and FET gate contacts are formed by three successive metallization operations in the upper part.

The FET stripe or mesa is etched in the upper part.

PIN layers 13 through 15 are removed from the waveguide part.

The layer 11 is then removed to leave a point in the mode transformer zone and part of the layer 11, for example a layer 0.2 μm thick, is etched laterally to form the waveguide in the wide mode zone.

To be more precise, in the preferred embodiment of the invention shown in accompanying FIG. 4, the mode transformer is etched in the shape of an hourglass.

The mode transformer therefore comprises three main parts: an entry part, a decreasing zone and an increasing zone.

The entry part is adapted to guide a wide mode. At this level, the electronic layers 62 (i.e., layers 1 through 6) define part of the mode transformer.

The wide mode is centered on the layer 6.

In the subsequent decreasing zone, the width of the stripe decreases in the propagation direction towards the electronic component to push the mode down. In this zone of decreasing width, the layer 11 is also reduced in width, for example to 0.2 μm.

The transition region between the decreasing zone and the increasing zone is not in the form of a point (starting at 0 μm by definition) but rather a truncated point, starting from a width in the order of 2 μm, for example. A truncated end like this is easier to make than a true point or a narrow point (a 1 μm point in the Bauer document [6], for example).

Forming the mode transformer as an hourglass is therefore particularly important because it facilitates the technology. It makes it possible to use low-cost optical lithography, for example.

The mode transformer structure of the present invention can be grown by a single stage of epitaxy. It avoids the formation of a point, as in the Schwander document, by pushing the mode down (see below) by virtue of the narrowness at the center of the hourglass. In the Schwander disclosure the narrowest zone is at least 7.5 μm wide. Also, in the present invention the mode is pushed down by virtue of the presence of the circuitry waveguide above the structure and the presence of the coupling guide below it.

The mode is at its deepest location when it reaches the neck (narrowest part) of the hourglass. The wide mode to guided mode transition occurs here.

In the subsequent increasing zone, the width of the stripe increases in the propagation direction towards the electronic component. Also, in the increasing zone the full thickness (0.65 μm) of the layer 11 is preserved. The increasing zone therefore includes, starting from the neck of the hourglass and in the propagation direction, a first part in which the layer 11 without the layer 12 has its full thickness (0.65 μm) and a second part in which the stacked layers 11 and 12 together form a waveguide 0.9 μm thick.

The transition from the wide entry mode (centered in the layer 6) to a narrower mode (centered in the layer 11) occurs in the increasing zone, in the upward direction.

The signal conveyed in this guide is treated optically and then electronically.

The thickness of the waveguide layer 11 therefore increases from 0.2 μm at the mode transformer entry to 0.65 μm in the mode transition zone corresponding to the neck of the hourglass and finally to 0.9 μm in the waveguide stripe leading to the optical function component.

Use of thin layers 7 and 9 in the mode transformer further dilutes the mode.

In the context of the present invention, it is advantageous for the mode transformer to be constituted from a diluted quaternary (rather than diluted quantum wells), for example in the form of three thin (250 Å) quaternary layers 1, 3 separated by InP layers about 1 μm thick.

As shown in FIG. 4, part of the layers 10, 9, 8 is laterally etched in a self-aligned fashion, using the layer 11 as a mask to form the hourglass-shape mode transformer.

The interconnect lands are then drawn using air bridges, in the manner familiar to those skilled in the art.

The above method can produce a highly sensitive high data rate receiver with no coupling losses and with coupling tolerances increased by a factor of not less than 3.

The method just described can be extended to the manufacture of detector strips, for example.

The structure forming an optical emitter or an electrical/optical transducer with integrated control electronics and the method of manufacturing it will be described next, with reference to accompanying FIG. 5.

In a manner similar to that of the previous example, the first step is to produce a semiconductor substrate 50 etched with a right-angle vertical step. The layers 1 through 12 listed in Table II are then deposited epitaxially. The thickness of the step 52 etched in the substrate 50 corresponds to the thickness of layers 6 through 14 and is 2.3 μm in this example.

The layers 1 through 5 deposited on the upper part of the substrate form field-effect transistors. All the layers deposited on the lower part 56 of the substrate form a laser type optical structure.

To this end, a grating is configured holographically in the layers 10, 12.

TABLE II

| layer | material | gap | thick-ness | doping | type | index | comment |
|---|---|---|---|---|---|---|---|
| 12 | InP | | 250Å | <5.10$^{15}$ | n– | 3.172 | grating |
| 11 | GaInAsP | 1.3μ | 250Å | <5.10$^{15}$ | n– | 3.381 | grating |
| 10 | InP | | 250Å | <5.10$^{15}$ | n– | 3.172 | grating |
| 9 | GaInAsP | 1.5μ | 0.2μ | <5.10$^{15}$ | n– | 3.524 | laser |
| 8 | InP | | 0.5μ | 10$^{18}$ | n+ | 3.13 | laser n contact |
| 7 | InGaAsP | | 0.05μ | 10$^{18}$ | n+ | 3.35 | laser n contact |
| 6 | InP | | 0.5μ | 10$^{18}$ | n+ | 3.13 | laser n contact |
| 5 | GaInAsP | 1.37 | 250Å | <5.10$^{15}$ | n– | 3.4 | FET contact |
| 4 | AlInAs | | 500Å | <5.10$^{15}$ | n– | 3.21 | gate |
| 3 | GaInAsP | 1.3μ | 500Å | 4.10$^{17}$ | n | 3.381 | channel |
| 2 | AlInAs | | 300Å | <5.10$^{15}$ | n– | 3.21 | buffer |
| 1 | InP substrate | | 500Å | .10$^{17}$ | S.I. | 3.169 3.169 | buffer |

The laser stripe is etched in layer 9, in the lower part. At the same time layers 8 through 12 are removed from the field-effect transistor region in the upper part.

The active layer 9 is formed to a point in the mode transformer zone (see FIG. 5) or, to facilitate implementation, an hourglass-shape mode transformer can be used, as shown in FIG. 4 and described previously.

The wide mode stripe formed by layers 7, 8 is stripe etched with the parts assigned to the n+lands protected.

Further (selective or otherwise) epitaxy grows the laser p+ consisting of the two layers 13 and 14 listed in Table III.

TABLE III

| layer | material | gap | thick-ness | doping | type | index | comment |
|---|---|---|---|---|---|---|---|
| 14 | GaInAs | | 250Å | <5.10$^{17}$ | p+ | 3.535 | laser p contact |
| 13 | InP | | 2 μm | <5.10$^{17}$ | p+ | 3.17 | laser p contact |

The field-effect transistor layer is then exposed on the upper part 54 of the substrate by removing layers 6, 7, 13 and 14. When layers 6 through 14 have been removed from the upper part 54 in this way, a planar structure is obtained in which the top surface of the layer 5 in the upper part 54 is flush with the top surface of the layer 14 in the lower part of the substrate.

The laser structure is isolated by means of proton implantation, in the manner familiar to the person skilled in the art, leaving a path for the front face n contact.

A hole is formed in the laser zone, beside the etched stripe in the layer 9, to enable recovery of the n contact formed in the layer 7.

The p and n contacts and the Gate of the transistor are formed by three successive metallizations on the upper part of the substrate.

The field-effect transistor stripe is then etched. After removing the layer 12, part of the layer 11 in the wide mode part is etched to achieve the lateral confinement. Finally, the interconnect lands are drawn using air bridges.

Figure 5:
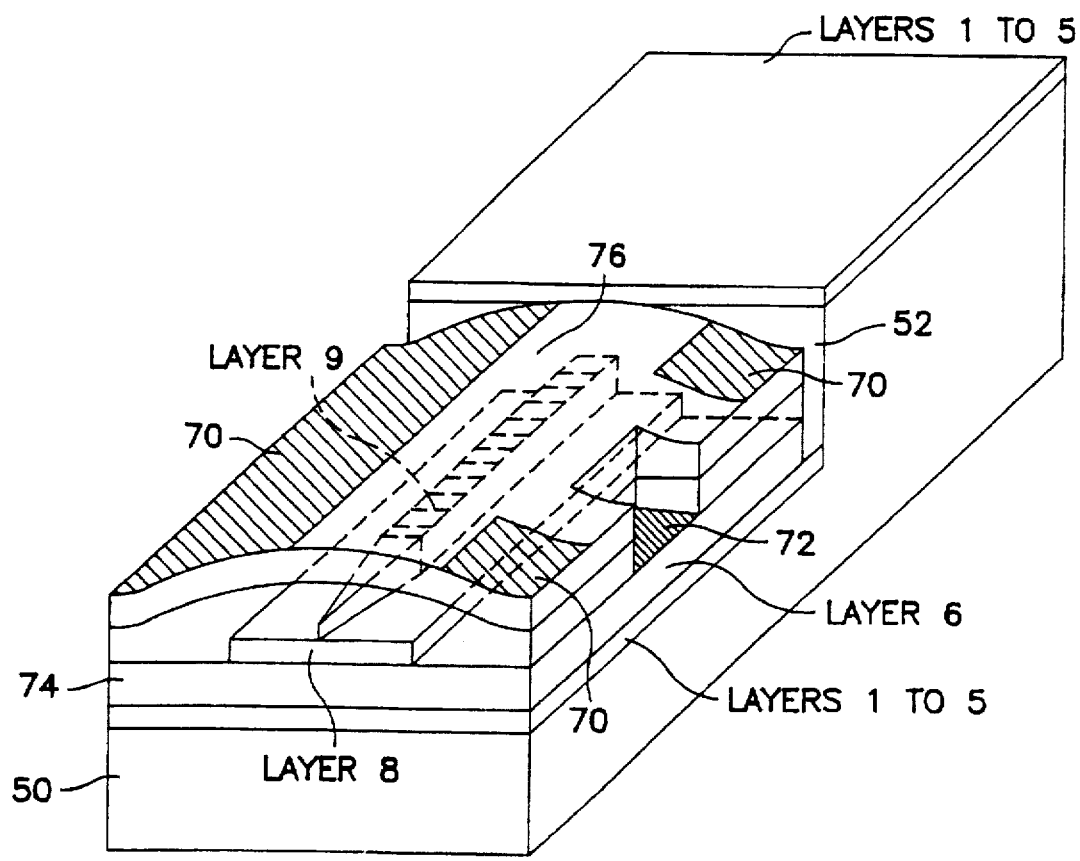
FIG. 5 is a partial perspective view of an opto-electronic structure of the present invention, of the type comprising an optical emitter or an electrical-to-optical transducer, possessing integrated control electronics.

Accompanying FIG. 5 shows the proton implanted isolation zones 70 (shaded) and the opening 72 beside the stripe in the laser zone to recover the n contact, the face 74 coupling with the wide mode waveguide, in the layer 6, and the p contact 76.

Thin quaternary InGaAsP layers can be added in layers 6 and 11 to produce a wider rounder mode. The layer 7 can be replaced with quantum wells or other higher performance laser structures.

The method can naturally be adapted to suit other types of laser structure.

The method described above produces an optical emitter or electrical/optical transducer with integrated control electronics and with wider tolerances and increased coupling efficiency.

The method can be extended to the fabrication of optical emitter strips or electrical/optical transducers having integrated control electronics.

In the embodiments of the invention described above, the semiconductor material layers which simultaneously form the electronic function component and layers in the mode transformer zone are made from a homogeneous material which has an apparent forbidden band gap such that the operating wavelength is not absorbed by these layers.

As an alternative, these layers can be treated locally so that the material is rendered non-absorbent in the optical part and/or so that the material has a narrow forbidden band gap in the electronic component part.

In a first implementation the semiconductor material layers 62 which simultaneously form the electronic function component and layers in the mode transformer zone are made from a material that is initially homogeneous and is rendered locally non-absorbent at the operating wavelength in the optical part.

In a second implementation, the semiconductor material layers 62 which simultaneously form the electronic function component and layers in the mode transformer zone are made from a material that is initially homogeneous and is locally treated in the electronic function component part to have a forbidden band gap compatible with that function.

Any technique known to those skilled in the art can be used for this treatment of the semiconductor material, for example locally selective epitaxy, partial or total mixing of the materials constituting the layer concerned, etc. Such treatments are described in the following documents, for example:

[8] Moo-Sung Kim, Catherine Caneau, Etienne Colas and Rajaram Bhat, "Selective zone growth of InGaAsP by OMVPE", Journal of Crystal Growth 123 (1992) 69–74, and

[9] Robert L. Thornton, William J. Mosby and Thomas L. Paoli, "Monolithic Waveguide Coupled Cavity Lasers and Modulators Fabricated by Impurity Induced Disordering", Journal of Lightwave Technology, vol. 6, No 6, June 1988.

We claim:

1. A semiconductor opto-electronic device including at least one electronic function component (62), at least one optical function component (60) and a mode transformer associated with the optical function component, wherein at least some layers of the semiconductor material constituting the electronic function component also form optical layers in a mode transformer zone and, at least in the mode transformer zone, said semiconductor material layers (62) are non-absorbent at an operating wavelength, and wherein said semiconductor material layers (62) simultaneously forming the electronic function component and layers in the mode transformer zone are made from a material that is initially homogeneous and is rendered locally non-absorbent at the operating wavelength in the optical part.

2. A device according to claim 1, wherein the treatment of the semiconductor material layers (62) to render them locally non-absorbent at the operating wavelength in the optical part and/or to impart to the material a forbidden band gap compatible with the electronic function are selected from the group comprising locally selective epitaxy and total or partial mixing of the materials constituting the layer or layers concerned.

3. A device according to claim 1, wherein the various layers (62) of semiconductor material constituting the device are deposited epitaxially on a substrate including an etched step (52).

4. A device according to claim 5, wherein the height (H) of the etched step (52) is equal to the sum of the thicknesses of the layers (60) deposited epitaxially less the thickness of the layers (62) constituting the electronic function device.

5. A device according to claim 3, wherein, after epitaxy, the layers on top of those (62) constituting the electronic function component are removed at the top (54) of the etched step of the substrate (50).

6. A device according to claim 1, wherein said device constitutes a waveguide-PIN-HFET.

7. A method of fabricating an opto-electronic device, wherein said method includes the step of forming a coupling guide forming an hourglass-shape mode transformer above said coupling guide and forming a circuitry waveguide above the mode transformer, said mode transformer having a wide mode entry part, a zone of decreasing width to push down the mode toward the coupling guide and a zone of increasing width to transfer the wide mode to said circuitry waveguide, wherein a surface layer of the mode transformer is etched in its thickness in said zone of decreasing width.

8. A method according to claim 7, wherein the hourglass-shape mode transformer has a neck of non-null width.

9. A method according to claim 8, wherein the width of the neck of the hourglass-shape transformer is in the order of 2 µm.

10. A method according to claim 7, wherein the thickness of the surface layer of the mode transformer is in the order of 0.2 µm in the zone of decreasing width.

11. A method according to claim 7, wherein the thickness of the surface layer of the mode transformer is in the order of 2 µm in the zone of increasing width.

12. A method of fabricating an opto-electronic device according to claim 7, wherein said method includes the steps of:

(a) depositing layers of semiconductor material epitaxially onto an etched substrate (50);

(b) removing from the upper part of the substrate the deposited layers of semiconductor material on top of a lower group (62) later to form an electronic function component; and (c) conforming at least some of the layers (60) deposited on the lower part of the substrate as a mode transformer so that at least some of the layers (62) of semiconductor material constituting the electronic function component simultaneously form optical layers in the mode transformer zone and, at least in the mode transformer zone, these semiconductor material layers are non-absorbent at the operating wavelength.

13. A method according to claim 12, wherein the height (H) of the etched step on the substrate (50) is equal or nearly equal to the sum of the thickness of the layer deposited epitaxially less than thickness of the layers (62) constituting the electronic function component.

14. A method according to claim 12, wherein the mode transformer is formed by total etching of a stripe of the guide layer in zones (66) with a varying pitch.

15. A semiconductor opto-electronic device including at least one electronic function component, at least one optical function component and a mode transformer associated with the optical function component, wherein at least some layers of the semiconductor material constituting the electronic function component also form optical layers in the mode transformer zone and, at least in the mode transformer zone, these semiconductor material layers are non-absorbent at the operating wavelength, and wherein said semiconductor material layers simultaneously forming the electronic function component and layers in the mode transformer zone are made from a material that is initially homogeneous and is rendered locally non-absorbent at the operating wavelength in the optical part.

16. A device according to claim 15, wherein the treatment of the semiconductor material layer to render them locally non-absorbent at the operating wavelength in the optical part and/or to impart to the material a forbidden band gap compatible with the electronic function are selected from the group comprising locally selective epitaxy and total or partial mixing of the material constituting the layer or layers concerned.

17. A semiconductor opto-electronic device including at least one electronic function component, at least one optical function component and a mode transformer associated with the optical function component, wherein at least some layers of the semiconductor material constituting the electronic function component also form optical layers in the mode transformer zone and, at least in the mode transformer zone, these semiconductor material layers are non-absorbent at the operating wavelength, wherein the various layers of semiconductor material constituting the device are deposited epitaxially on a substrate including and etched step and wherein the semiconductor material layers in the mode transformer zone are etched in the shape of an hourglass comprising a wide mode entry part, a zone of decreasing width to push down the mode and a zone of increasing width to transfer the wide mode to a wavelength.

18. A device according to claim 17, wherein the height of the etched step is equal to the sum of the thickness of the layer deposited epitaxially less the thickness of the layers constituting the electronic function device.

19. A device according to claim 17, wherein, after epitaxy, the layers on top of those constituting the electronic function component are removed at the top of the etched step of the substrate.

20. A semiconductor opto-electronic device including at least one electronic function component, at least one optical function component and a mode transformer associated with the optical function component, wherein at least some layers of the semiconductor material constituting the electronic function component also form optical layers in the mode transformer zone and, at least in the mode transformer zone, these semiconductor material layers are non-absorbent at the operating wavelength, wherein the mode transformer is formed by total etching of a stripe of the guide layer in zones of varying pitch.

21. A semiconductor opto-electronic device constituting a waveguide-PIN-HFET, including at least one electronic function component, at least one optical function component and a mode transformer associated with the optical function component, wherein at least some layers of the semiconductor material constituting the electronic function component also form optical layers in the mode transformer zone and, at least in the mode transformer zone, these semiconductor material layers are non-absorbent at the operating wavelength.

22. A semiconductor opto-electronic device including at least one electronic function component, at least one optical function component and a mode transformer associated with the optical function component, wherein at least some layers of the semiconductor material constituting the electronic function component also form optical layers in the mode transformer zone and, at least in the mode transformer zone, these semiconductor material layers are non-absorbent at the operating wavelength, wherein the mode transformer is etched in the shape of an hourglass, which has a wide mode entry part, a zone of decreasing width to push down the mode and a zone of increasing width to transfer the wide mode to a waveguide, and the hourglass-shape mode transformer has a neck of non-null width, and wherein the device further comprises a coupling guide below the mode transformer and a circuitry waveguide above the mode transformer.

23. A method of fabricating an opto-electronic device, wherein said method includes the step of forming an hourglass-shape mode transformer having a wide mode entry part, a zone of decreasing width to push down the mode and a zone of increasing width to transfer the wide mode to a waveguide, and wherein the surface layer of the mode transformer is etched in its thickness substantially entirely over its zone of decreasing width.

24. A method according to claim 23, wherein the thickness of the surface layer of the mode transformer is in the order of 0.2 µm in the zone of decreasing width.

25. A method according to claim 22, wherein the thickness of the surface layer of the mode transformer is in the order of 2 µm in the zone of increasing width.

26. A method of fabricating an opto-electronic device, wherein said method includes the steps of:

(a) depositing layers of the semiconductor material epitaxially onto an etched substrate;

(b) removing from the upper part of the substrate the deposited layers of semiconductor material on top of a lower group later to form an electronic function component; and (c) conforming at least some of the layers deposited on the lower part of the substrate as a mode transformer so that at least some of the layers of semiconductor material constituting the electronic function component simultaneously form optical layers in the mode transformer zone and, at least in the mode transformer zone, these semiconductor material layers are non-absorbent at the operating wavelength.

27. A method according to claim 26, wherein the height of the etched step on the substrate is equal or nearly equal to the sum of the thickness of the layers deposited epitaxially less the thickness of the layers constituting the electronic function component.

28. A method according to claim 26, wherein the mode transformer is formed by total etching of a stripe of the guide layer in zones with a varying pitch.

* * * * *